United States Patent
Liang et al.

(10) Patent No.: US 9,899,214 B1
(45) Date of Patent: Feb. 20, 2018

(54) METHOD FOR FABRICATING A VERTICAL HETEROJUNCTION OF METAL CHALCOGENIDES

(71) Applicant: NATIONAL TSING HUA UNIVERSITY, Hsinchu (TW)

(72) Inventors: Jenq-Horng Liang, Hsinchu (TW); Hsu-Sheng Tsai, Taipei (TW); Wei-Yen Woon, Taoyuan (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 15/620,840

(22) Filed: Jun. 13, 2017

(30) Foreign Application Priority Data

Feb. 17, 2017 (TW) .............................. 106105339 A (51) Int. Cl.
*H01L 21/00* (2006.01)
*H01L 21/02* (2006.01)

(52) U.S. Cl.
CPC .... *H01L 21/02614* (2013.01); *H01L 21/0242* (2013.01); *H01L 21/0256* (2013.01); *H01L 21/02557* (2013.01); *H01L 21/02562* (2013.01); *H01L 21/02664* (2013.01)

(58) Field of Classification Search
CPC ........... H01L 21/02614; H01L 21/0242; H01L 21/02557; H01L 21/0256; H01L 21/02562; H01L 21/02664; H01L 21/02417; H01L 21/02485; H01L 21/02568; H01L 31/0324
See application file for complete search history.

(56) References Cited

U.S. PATENT DOCUMENTS

| | | | | |
|---|---|---|---|---|
| 2004/0043585 | A1* | 3/2004 | Moore | H01L 27/2463 438/510 |
| 2008/0246016 | A1* | 10/2008 | Kakoschke | G11C 13/0004 257/5 |
| 2010/0176454 | A1* | 7/2010 | Hooker | H01L 21/823842 257/369 |
| 2015/0294868 | A1* | 10/2015 | Schmidt | H01L 21/3225 257/607 |

* cited by examiner

*Primary Examiner* — Thanh T Nguyen
(74) *Attorney, Agent, or Firm* — CKC & Partners Co., Ltd.

(57) ABSTRACT

The present disclosure provides a method for fabricating a vertical heterojunction of metal chalcogenides. The method includes steps of providing a multi-layer material, performing an ion implantation and performing an annealing. The multi-layer material has a carrier and a metal layer, in which the metal layer covers the carrier to form an interface. The carrier includes an oxide of a first metal element, and the metal layer includes a second metal element. The step of performing the ion implantation is to inject a chalcogen ion source into the multi-layer material to allow a plurality of chalcogen ions to be implanted in a depth area of the multi-layer material, and the depth area includes the interface. The step of performing the annealing is to form a first metal chalcogenide and a second metal chalcogenide at two sides of the interface, respectively.

12 Claims, 7 Drawing Sheets
(1 of 7 Drawing Sheet(s) Filed in Color)

METHOD FOR FABRICATING A VERTICAL HETEROJUNCTION OF METAL CHALCOGENIDES

RELATED APPLICATIONS

This application claims priority to Taiwan Application Serial Number 106105339, filed Feb. 17, 2017, which is herein incorporated by reference.

BACKGROUND

Technical Field

The present disclosure relates to a method for fabricating a vertical heterojunction of metal chalcogenides. More particularly, the present disclosure relates to a method for fabricating a vertical heterojunction of metal chalcogenides on a substrate directly.

Description of Related Art

The semiconductor industry continues to improve component performance by narrowing the scale of transistors. However, how to manufacture and operate the abovementioned components for the increasingly compact configuration is a challenge. Accordingly, the industry tries to find a substitute materiel and introduce a new design or configuration. A two-dimensional semiconductor material with an atomic-layer thickness, such as graphene, has attracted much attention recently. However, the graphene has disadvantages, such as high cost and difficult manufacturing process, and thus is not benefit for mass production.

After the graphene, a metal chalcogenide has great potential to become an important material of the next generation of electronics and optoelectronics industry due to its appropriate energy gap. Another feature of the two-dimensional material is that different materials can be free stacked to form various vertical heterojunctions. Electronic, optical and transmission characteristics of the vertical heterojunctions depend on the stacked materials and types. Thus, such the customized material becomes an important research project in the physical and material field.

In details, current manufacturing processes for the metal chalcogenides and vertical heterojunctions include artificial tearing, mechanical exfoliation and chemical vapor deposition. However, a coupling effect between two materials, which are stacked by the artificial tearing, may be affected due to impurities of an interface between the two materials. Although quality of a metal chalcogenide film obtained from a specific metal chalcogenide bulk material by the mechanical exfoliation is better, the metal chalcogenide film with the broken area and irregular shape cannot be mass production. In addition, the chemical vapor deposition also can be performed to deposit a specific precursor on a substrate covered by silicon dioxide to form the metal chalcogenide film. However, the silicon dioxide will be corroded in the deposition so that the insulation of the metal chalcogenide film is failed. Accordingly, a complicate and uncontrolled transfer process cannot be omitted and cannot be applied to manufacture a continuous film with a large area.

Accordingly, how to develop a simple and appropriate method for fabricating a vertical heterojunction of metal chalcogenides with low cost becomes an important work in the future.

SUMMARY

The present disclosure provides a method for fabricating a vertical heterojunction of metal chalcogenides. The method includes steps of providing a multi-layer material, performing an ion implantation and performing an annealing. In the step of providing the multi-layer material, the multi-layer material includes a carrier and a metal layer for covering the carrier for forming an interface. The carrier includes an oxide of a first metal element, and the metal layer includes a second metal element. In the step of performing the ion implantation, a chalcogen ion source is injected into the multi-layer material through one side near the metal layer so as to allow a plurality of chalcogen ions to be implanted in a depth area of the multi-layer material. In particular, the depth area includes the interface. In the step of performing the annealing, a first metal chalcogenide and a second metal chalcogenide are formed, respectively, at two sides of the interface.

These and other features, aspects, and advantages of the present disclosure will become better understood with reference to the following description and appended claims.

BRIEF DESCRIPTION OF THE DRAWINGS

The patent or application file contains at least one drawing executed in color. Copies of this patent or patent application publication with color drawing(s) will be provided by Office upon request and payment of the necessary fee. The present disclosure can be more fully understood by reading the following detailed description of the embodiment, with reference made to the accompanying drawings as follows.

DETAILED DESCRIPTION

Figure 1:
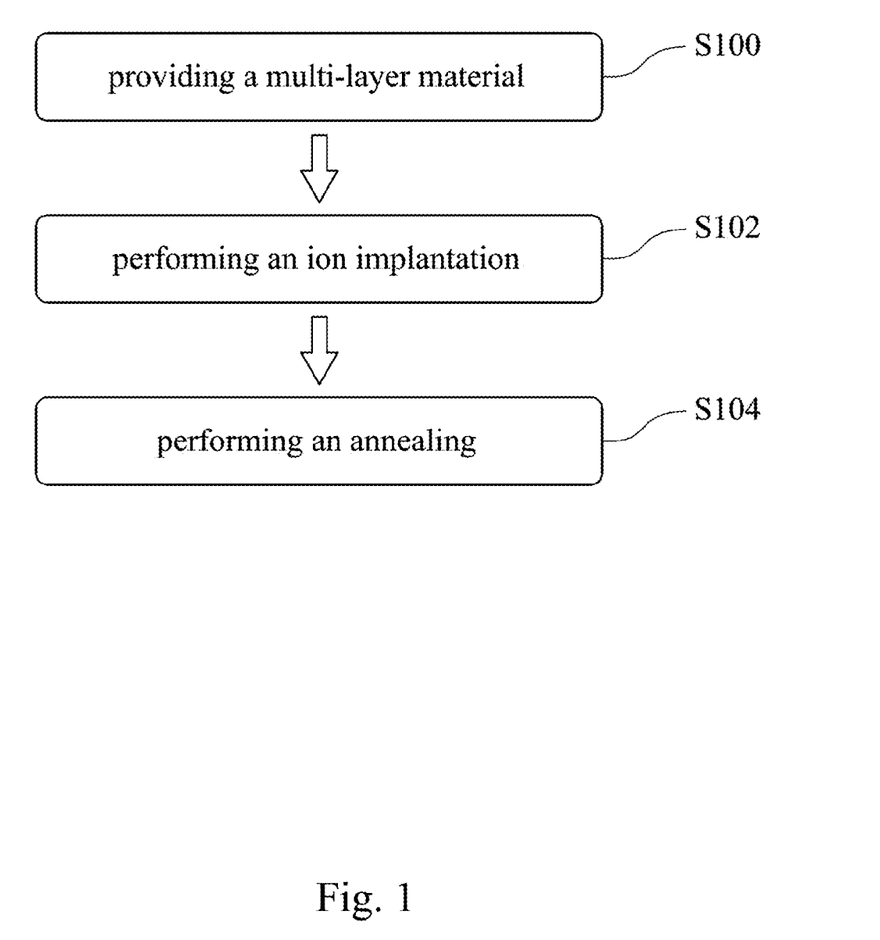
FIG. 1 is a flow chart of a method for fabricating a vertical heterojunction of metal chalcogenides according to one embodiment of the present disclosure.

Please refer to FIG. 1, which is a flow chart of a method for fabricating a vertical heterojunction of metal chalcogenides according to one embodiment of the present disclosure. The method includes Step S100, Step S102 and Step S104.

A multi-layer material is provided in Step S100. The multi-layer material includes a carrier and a metal layer for covering the carrier so as to form an interface. In particular, the metal layer can be but not limited to be formed on the carrier by a sputtering process. More particularly, a thickness of the metal layer is larger than or equal to 20 nm and smaller than or equal to 40 nm. The carrier includes an oxide of a first metal element, and the first metal element can be aluminum, silicon, magnesium, zinc or titanium. That is, the carrier can be made of aluminum oxide, quartz, magnesium oxide, zinc oxide or titanium dioxide. The metal layer includes a second metal element, and the second metal element can be molybdenum, tungsten, platinum, titanium, tin or hafnium.

An ion implantation is performed in Step S102, and thus a chalcogen ion source is provided. The chalcogen ion source can be a sulfide ion source, a selenium ion source or a tellurium ion source provided, separately, by ionizing, extracting and accelerating sulfur hexafluoride ($SF_6$), solid selenium or solid tellurium. Then, the chalcogen ion source is injected into the multi-layer material through one side near the metal layer so as to allow a plurality of chalcogen ions to be implanted in a depth area of the multi-layer material. In particular, the depth area means an implantation range of the chalcogen ions and includes a portion of the metal layer, a portion of the carrier and the interface. The depth area is an area within 10 nm from the interface. Specifically, the depth area includes the portion of the metal layer within a distance of 10 nm from the interface, the portion of the carrier within a distance of 10 nm from the interface and the interface, wherein the distance is vertical to the interface.

In Step S102, an accelerated energy and dose of the chalcogen ion source can be adjusted according to the thickness and material of the metal layer since the chalcogen ion source is injected into the multi-layer material through one side near the metal layer and to be implanted into the depth area, which includes the interface. For example, the accelerated energy of the chalcogen ion source in Step S102 can be larger than or equal to 30 keV and smaller than or equal to 150 keV, and the dose of the chalcogen ion source in Step S102 can be larger than or equal to $1E16$ ions/$cm^2$ and smaller than or equal to $1E17$ ions/$cm^2$. Accordingly, the chalcogen ions have a maximum concentration at the interface.

In addition, the chalcogen ion source has an injection direction. For preventing a short channel effect, an angle between the injection direction of the chalcogen ion source and a thickness direction of the metal layer is necessary. That is, the chalcogen ion source is not injected into the metal layer in a vertical direction. Preferably, the abovementioned angle can be larger than 0 degree and smaller than or equal to 10 degrees.

An annealing is performed in Step S104 for forming a first metal chalcogenide and a second metal chalcogenide at two sides of the interface, respectively. In details, the multi-layer material is annealed under a certain temperature in Step S104 to allow the chalcogen ions in the depth area to diffuse gradually. Then, the chalcogen ions react with the oxide of the first metal element of the carrier within the depth area and further substitute oxygen atoms for forming the first metal chalcogenide. In addition, the chalcogen ions may diffuse to substitute oxygen atoms of the oxide of the first metal element of the carrier, which is out of the depth area, so that a thickness of the formed first metal chalcogenide can be larger than or equal to a thickness of the carrier within the depth area. Similarly, the chalcogen ions react with the second metal element of the metal layer within the depth area for forming the second metal chalcogenide. The chalcogen ions also can diffuse to react with the second metal element of the metal layer, which is out of the depth area, so that a thickness of the formed second metal chalcogenide can be larger than or equal to a thickness of the metal layer within the depth area. In other words, the total of the range of the first metal chalcogenide and the range of second metal chalcogenide may be greater than the depth area due to the diffusion of the chalcogen ions. Theoretically, Step S104 turns the portion of the carrier near the interface into the first metal chalcogenide and turns the portion of the metal layer near the interface into the second metal chalcogenide. In particular, the annealing can be performed under a temperature larger than or equal to 600° C. and smaller than or equal to 900° C. and for a period larger than or equal to 0.5 hour and smaller than or equal to 1 hour.

The carrier can be a substrate so as to form the vertical heterojunction of metal chalcogenides on the substrate directly. Thus, the transfer process adopted in the prior art can be bypassed for shortening the manufacturing time and preventing the risk of low-yield. The fabricating method of the present disclosure is simple and can be applied to various metal materials so as to broaden the application range. Moreover, various vertical heterojunctions can be formed by selecting the first metal element and the second metal element. That is, the first meat element and the second metal element can be chosen from an n-type semiconductor material and a p-type semiconductor material, respectively, so as to form a p-n junction. Thus, it is benefit for being an electronic component.

In the following, an example will be further provided to illustrate the above-mentioned method for fabricating the vertical heterojunctions of the metal chalcogenide in details. The accompanied effect will be further confirmed by various analysis method, such as a transmission electron microscopy, X-ray photoelectron spectroscopy, Raman spectrum and energy dispersive X-ray spectroscopy. However, the present disclosure is not limited thereto.

Example

Method for Fabricating a Vertical Heterojunction of Metal Chalcogenides

Figure 2A:
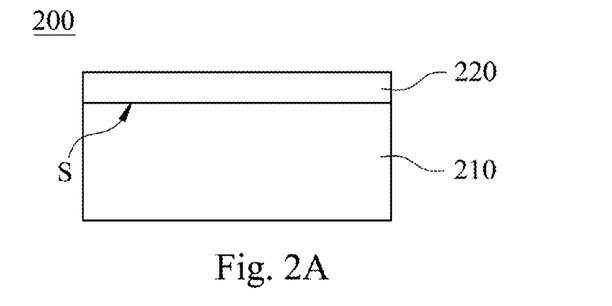
FIGS. 2A-2C are cross-sectional schematic views showing steps for fabricating a vertical heterojunction of metal chalcogenides of the present disclosure.
Figure 2B:
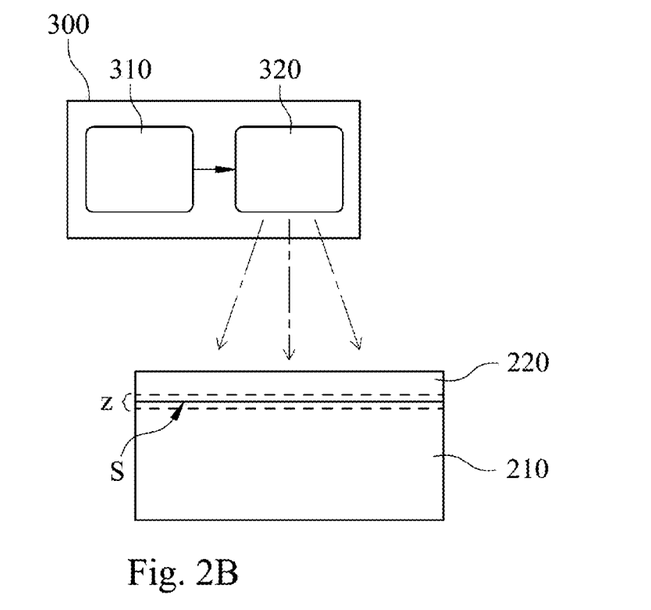
Figure 2C:
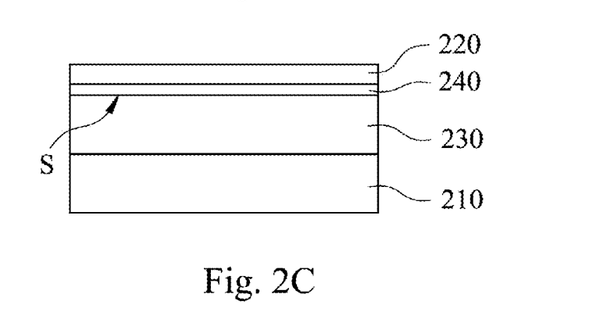

Please refer to FIGS. 2A-2C, which are cross-sectional schematic views showing steps for fabricating a vertical heterojunction of metal chalcogenides of the present disclosure. In FIG. 2A, a multi-layer material 200 is provided, which is corresponding to Step S100 in FIG. 1. In details, a metal layer 220 is formed on a carrier 210 by a sputtering process and covers the carrier 210 to form an interface S. In particular, the carrier 210 is made of aluminum oxide, the metal layer 220 is made of molybdenum, and a thickness of the metal layer 220 is 20 nm.

In FIG. 2B, an ion implantation is performed, which is corresponding to Step S102 in FIG. 1. As shown in FIG. 2B, Step S102 is performed in cooperated with an ion implantation device 300, in which the ion implantation device 300 at least includes an ion generation chamber 310 and an analysis magnet 320. The ion source is a selenium ion source herein. In details, a solid selenium is loaded into the ion generation chamber 310 and ionized. After ionizing, a plurality of ions are screened by passing through the analysis magnet 320 so as to obtain the selenium ion source. The details of the ion implantation device 300 are not main features in the present disclosure, and are not described herein. In addition, a robotic arm (not shown) can be further connected to the bottom of the multi-layer material 200 for tilting the multi-layer material 200 so as to allow an angle existing between an injection direction of the selenium ion source and a thickness direction of the metal layer 220. Preferably, the abovementioned angle is 7 degrees. The selenium ion source is then injected into the multi-layer material 200 through one side near the metal layer 220, wherein an accelerated energy of the implantation of the selenium ion source is set at 60 keV and a dose of the implantation of the selenium ion source is set at 1E16 ions/cm$^2$. Thus, a plurality of selenium ions are implanted in a depth area Z, where includes the interface S.

In FIG. 2C, the multi-layer material 200 is placed into a furnace for annealing, which is corresponding to Step S104 in FIG. 1. After annealing, a portion of the carrier 210 near the interface S turns into aluminum selenide ($Al_2Se_3$) 230, that is, the first metal chalcogenide, and a portion of the metal layer 220 near the interface S turns into molybdenum (IV) selenide ($MoSe_2$) 240, that is, the second metal chalcogenide. The molybdenum (IV) selenide 240 is an n-type semiconductor material, and the aluminum selenide 230 is a p-type semiconductor material. Thus, a vertical heterojunction formed between the aluminum selenide 230 and the molybdenum (IV) selenide 240 is also a p-n junction that can be applied as an electronic component.

Analysis for the Vertical Heterojunction of Metal Chalcogenides

Figure 3:
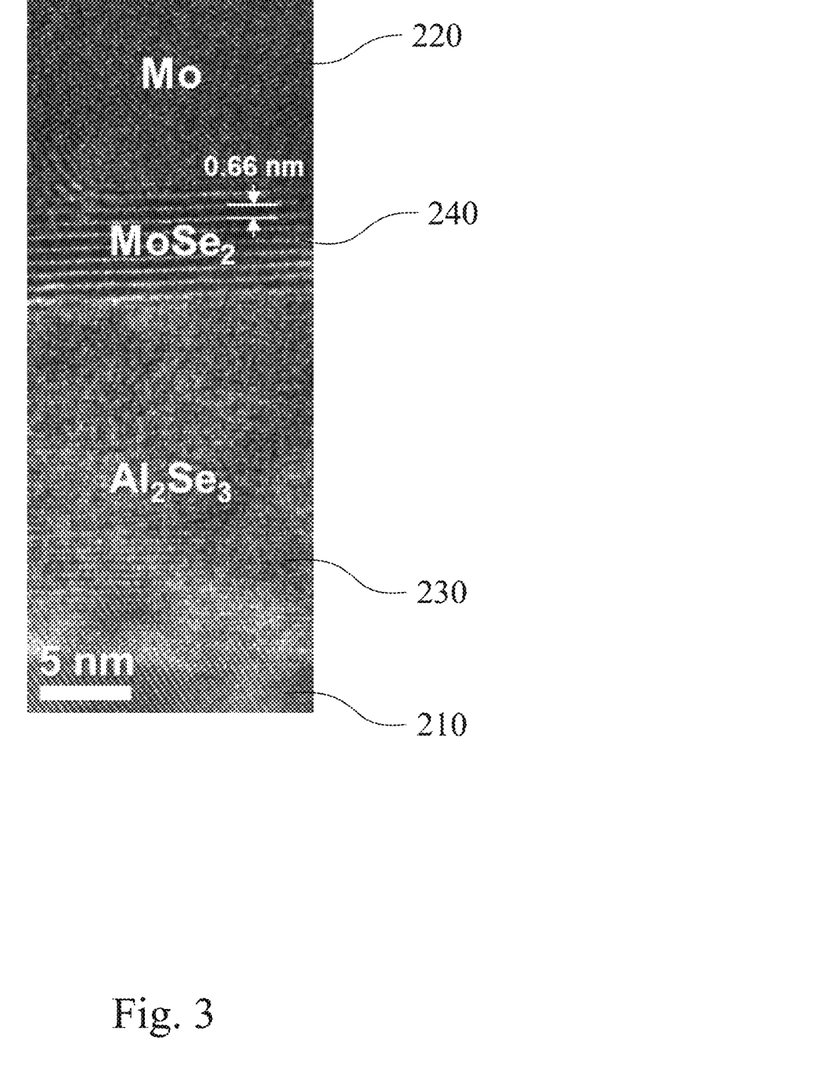
FIG. 3 is a transmission electron microscopic (TEM) image of the vertical heterojunction of metal chalcogenides in FIG. 2C.

Please refer to FIG. 3, which is a transmission electron microscopic image of the vertical heterojunction of metal chalcogenides in FIG. 2C. In FIG. 3, from top to bottom, the first layer is the metal layer 220, the second layer is the molybdenum (IV) selenide 240, the third layer is the aluminum selenide 230, and the fourth layer is the carrier 210. A layer spacing of ~0.66 nm in the second layer is measured and nearly consistent with a theoretical value of the molybdenum (IV) selenide. Thus, the material of the second layer is further confirmed.

Figure 4A:
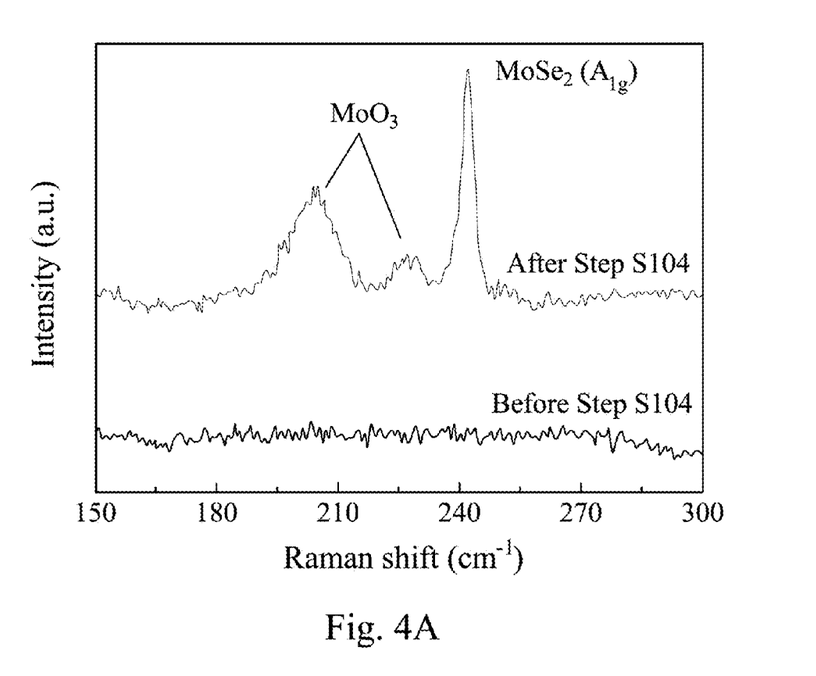
FIG. 4A is a Raman spectrum of the vertical heterojunction of metal chalcogenides in FIG. 3.
Figure 4B:
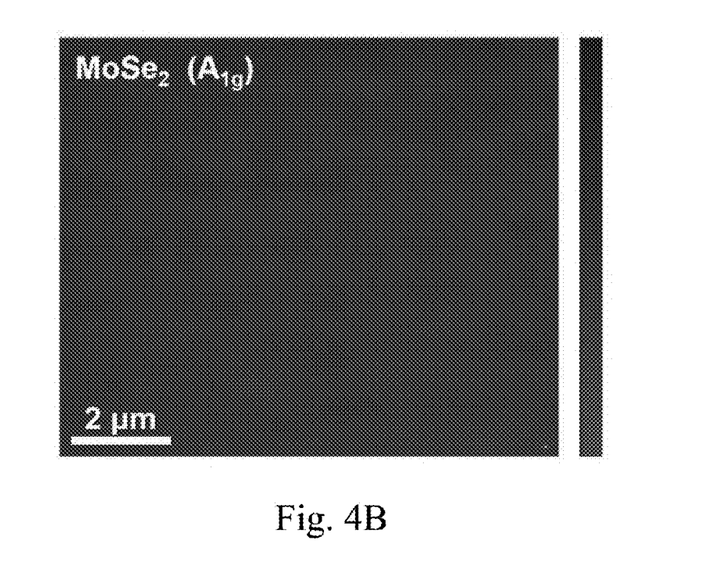
FIG. 4B is a Raman mapping result of FIG. 4A.

Please refer to FIG. 4A and FIG. 4B. FIG. 4A is a Raman spectrum of the vertical heterojunction of metal chalcogenides in FIG. 3, and FIG. 4B is a Raman mapping result of FIG. 4A. After implanting the selenium ions in the depth area Z of the multi-layer material 200, there is no significant signal shown in FIG. 4A. After the multi-layer material 200 is annealed, three Raman peaks located at ~205, ~228, and ~242 cm$^{-1}$ respectively emerge in the spectrum. The first two peaks are associated with molybdenum oxide at the surface, resulting from the inevitable oxidation during the annealing. The last one peak belongs to the $A_{1g}$ mode of molybdenum (IV) selenide. It confirms that the selenium ions will react with molybdenum during the annealing, and the molybdenum (IV) selenide 240 will be formed after the annealing. As shown in FIG. 4B, the Raman mapping result of the $A_{1g}$ peak of molybdenum selenide reveals that the molybdenum (IV) selenide 240 synthesized herein is uniform and continuous indeed. Accordingly, it further confirms that a uniformly continuous two-dimensional material with large area can be synthesized according to the present disclosure.

Figure 5A:
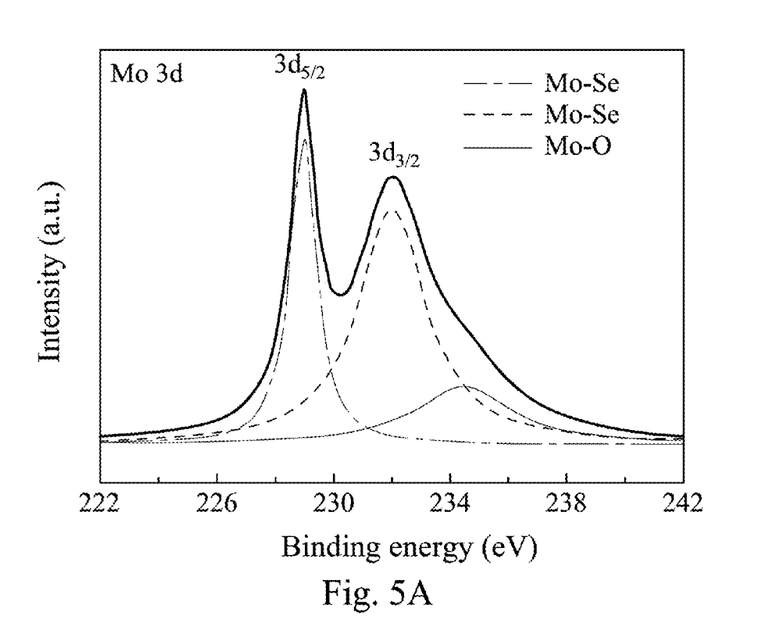
FIG. 5A is a Mo 3d X-ray photoelectron spectroscopy (XPS) spectrum of the vertical heterojunction of metal chalcogenides in FIG. 3.
Figure 5B:
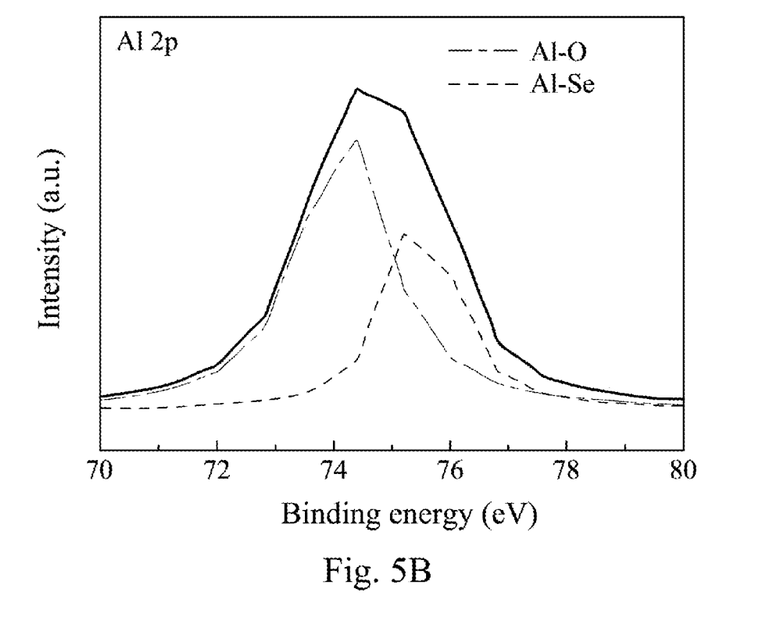
FIG. 5B is an Al 2p X-ray photoelectron spectroscopy spectrum of the vertical heterojunction of metal chalcogenides in FIG. 3.

FIG. 5A is a Mo 3d X-ray photoelectron spectroscopy spectrum of the vertical heterojunction of metal chalcogenides in FIG. 3, and FIG. 5B is an Al 2p X-ray photoelectron spectroscopy spectrum of the vertical heterojunction of metal chalcogenides in FIG. 3. Due to the spin-orbital splitting, the Mo 3d orbital splits into Mo $3d_{3/2}$ and Mo $3d_{5/2}$ so that feature peaks of Mo—Se bonding located at ~229 and ~232 eV, respectively, emerge in the spectrum of FIG. 5A. Then, signals of Al—O bonding and Al—Se bonding are revealed, respectively, at ~74.4 eV and ~75.2 eV in FIG. 5B. Thus, the vertical heterojunction formed between the aluminum selenide 230 and the molybdenum (IV) selenide 240 is further confirmed and is benefit for being the electronic component.

Figure 6A:
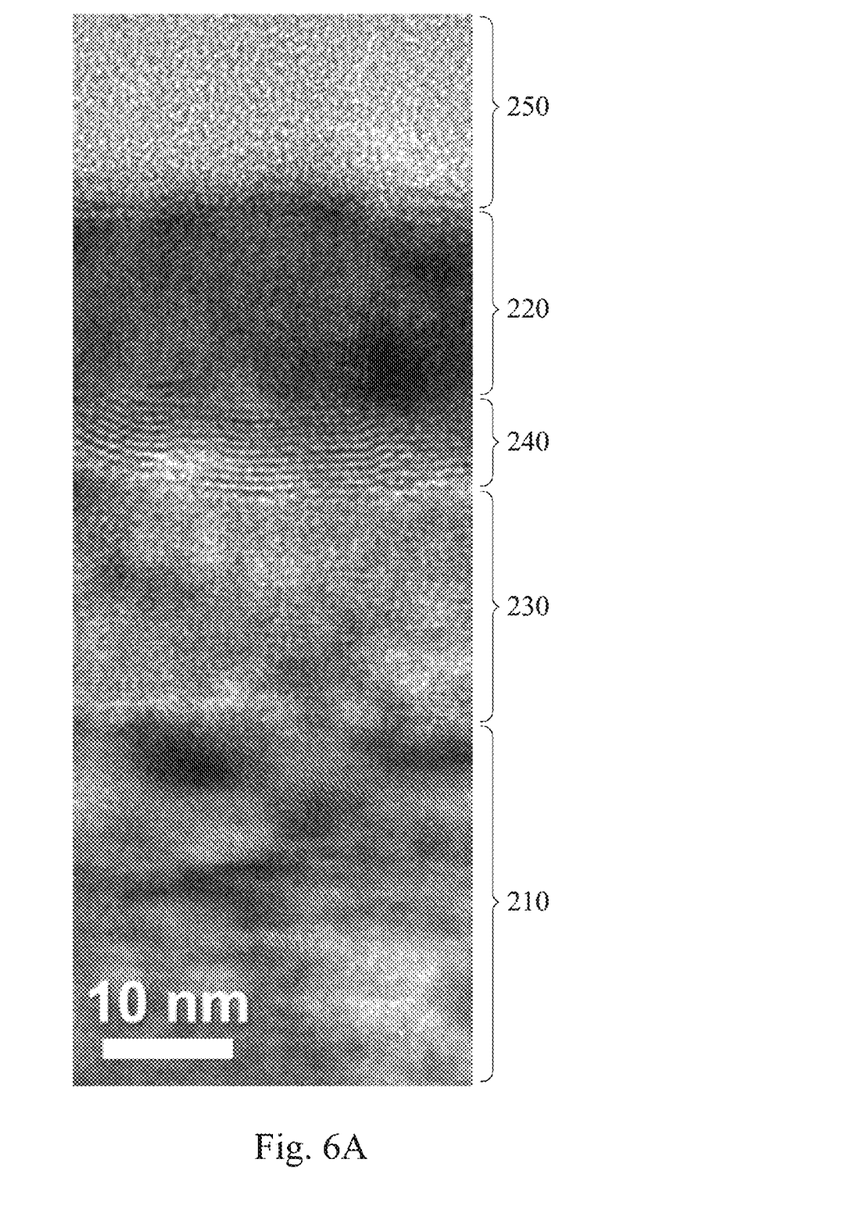
FIG. 6A is another transmission electron microscopic image of the vertical heterojunction of metal chalcogenides in FIG. 3.
Figure 6B:
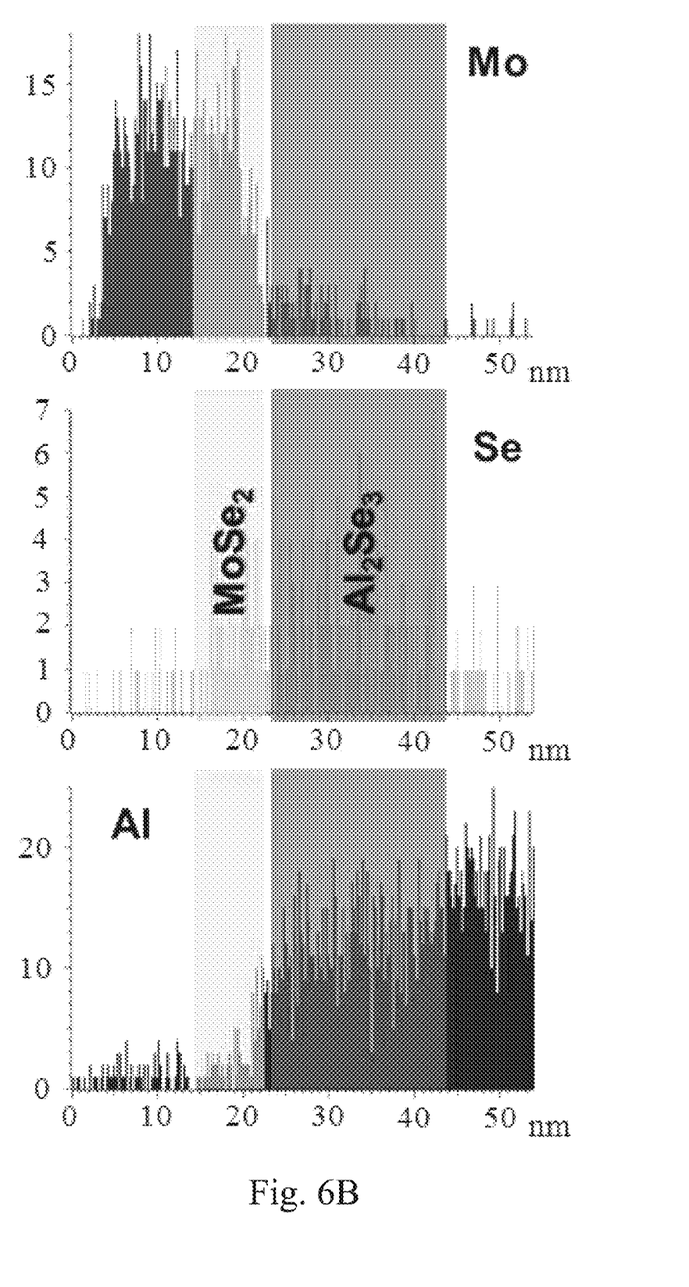
FIG. 6B shows elemental analysis results of the vertical heterojunction of metal chalcogenides in FIG. 6A.

Please refer to FIG. 6A and FIG. 6B. FIG. 6A is another transmission electron microscopic image of the vertical heterojunction of metal chalcogenides in FIG. 3, and FIG. 6B shows elemental analysis results of the vertical heterojunction of metal chalcogenides in FIG. 6A. In FIG. 6A, it shows a silicon dioxide layer 250, the metal layer 220 (that is, molybdenum), the molybdenum (IV) selenide 240, the aluminum selenide 230 and the carrier 210 (that is, aluminum oxide) from top to bottom. The silicon dioxide layer 250 is formed on the metal layer 220 for preparing the TEM sample, which is conventional and is not described herein. FIG. 6B shows the elemental analysis results of molybdenum, selenium and aluminum, respectively, obtained by scanning from top to bottom of FIG. 6A. According to the result of molybdenum, the content of molybdenum decreases progressively from top to bottom. As to the result of selenium, only two significant peaks appear at 15 nm and 45 nm. In the result of aluminum, the content of aluminum increases progressively from top to bottom. That is, the elemental analysis results are consistent with the structure of FIG. 2C.

To sum up, the present disclosure simplifies the fabricating process so as to directly form the vertical heterojunction of the metal chalcogenide on a substrate without an additional transfer process. Furthermore, the present disclosure can fabricate a large-scale metal chalcogenide so as to broaden the application range.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for fabricating a vertical heterojunction of metal chalcogenides, comprising:
    providing a multi-layer material, wherein the multi-layer material comprises:
        a carrier comprising an oxide of a first metal element; and
        a metal layer comprising a second metal element, wherein the metal layer covers the carrier to form an interface;
    performing an ion implantation for injecting a chalcogen ion source into the multi-layer material through one side near the metal layer so as to allow a plurality of chalcogen ions to be implanted in a depth area of the multi-layer material, wherein the depth area comprises the interface; and
    performing an annealing for forming a first metal chalcogenide and a second metal chalcogenide at two sides of the interface, respectively.

2. The method of claim 1, wherein the depth area is an area within 10 nm from the interface.

3. The method of claim 1, wherein the step of performing the annealing turns a portion of the carrier near the interface into the first metal chalcogenide and turns a portion of the metal layer near the interface into the second metal chalcogenide.

4. The method of claim 1, wherein the chalcogen ions are sulfide ions, selenium ions or tellurium ions.

5. The method of claim 1, wherein the carrier is made of aluminum oxide, quartz, magnesium oxide, zinc oxide or titanium dioxide.

6. The method of claim 1, wherein the second metal element is molybdenum, tungsten, platinum, titanium, tin or hafnium.

7. The method of claim 1, wherein a thickness of the metal layer is larger than or equal to 20 nm and smaller than or equal to 40 nm.

8. The method of claim 1, wherein an accelerated energy of the chalcogen ion source in the step of performing the implantation is larger than or equal to 30 keV and smaller than or equal to 150 keV.

9. The method of claim 1, wherein a dose of the chalcogen ion source in the step of performing the implantation is larger than or equal to 1E16 ions/cm$^2$ and smaller than or equal to 1E17 ions/cm$^2$.

10. The method of claim 1, wherein an angle between an injection direction of the chalcogen ion source in the step of performing the implantation and a thickness direction of the metal layer is larger than 0 degree and smaller than or equal to 10 degrees.

11. The method of claim 1, wherein the annealing is performed under a temperature larger than or equal to 600° C. and smaller than or equal to 900° C.

12. The method of claim 1, wherein the annealing is performed for a period larger than or equal to 0.5 hour and smaller than or equal to 1 hour.

* * * * *